(12) United States Patent
Nagata et al.

(10) Patent No.: US 6,618,111 B1
(45) Date of Patent: Sep. 9, 2003

(54) LIQUID CRYSTAL DISPLAY DEVICE

(75) Inventors: Katsunori Nagata, Yamatokoriyama (JP); Yoichiro Sakaki, Tsu (JP); Hisao Kawaguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/688,684

(22) Filed: Oct. 17, 2000

(30) Foreign Application Priority Data

Oct. 21, 1999 (JP) ............................................. 11-299921
Sep. 20, 2000 (JP) ........................................ 2000-285848

(51) Int. Cl.⁷ ............................................. G02F 1/1343
(52) U.S. Cl. .......................................... 349/149; 345/98
(58) Field of Search .......................... 349/149; 345/87, 345/89, 98, 99, 100, 101, 102, 103, 104

(56) References Cited

U.S. PATENT DOCUMENTS 5,936,603 A * 8/1999 Lippmann et al. .......... 345/101
6,052,171 A   4/2000 Kawaguchi
6,160,605 A * 12/2000 Murayama et al. ......... 349/149

FOREIGN PATENT DOCUMENTS

| JP | 3-114820 U | 11/1991 |
| JP | 4-313731 A | 11/1992 |
| JP | 8-146449 A | 6/1996 |
| JP | 8-304845 A | 11/1996 |
| JP | 10-214858 A | 8/1998 |

OTHER PUBLICATIONS

U.S. patent application Ser. No. 09/589,290, filed Jun. 8, 2000, entitled "Liquid Crystal Display Device".

* cited by examiner

Primary Examiner—Toan Ton
Assistant Examiner—P. R. Akkapeddi
(74) Attorney, Agent, or Firm—Nixon & Vanderhye P.C.

(57) ABSTRACT

To realize a liquid crystal display device of such a packaging structure that a drive voltage can be supplied to TCPs without being seriously affected by a voltage drop caused by an increased resistance of wires despite a growth in size of a liquid crystal panel, the liquid crystal panel includes: source TCPs connected to source wires; and a circuit substrate for supplying a liquid-crystal-drive signal to the source TCPs. Between the source TCPs, there are provided: transmission panel wires for transmitting the signal supplied by the circuit substrate sequentially from one source TCP to the next; and a flexible substrate for stabilizing the signal transmitted via the transmission panel wires.

28 Claims, 12 Drawing Sheets

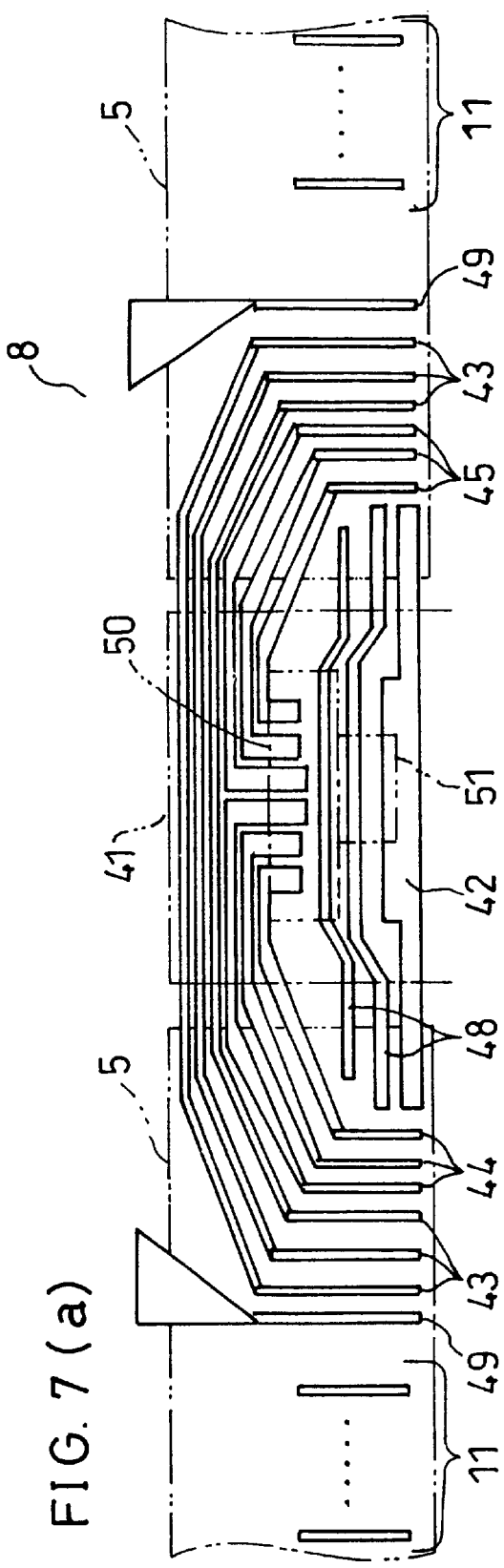
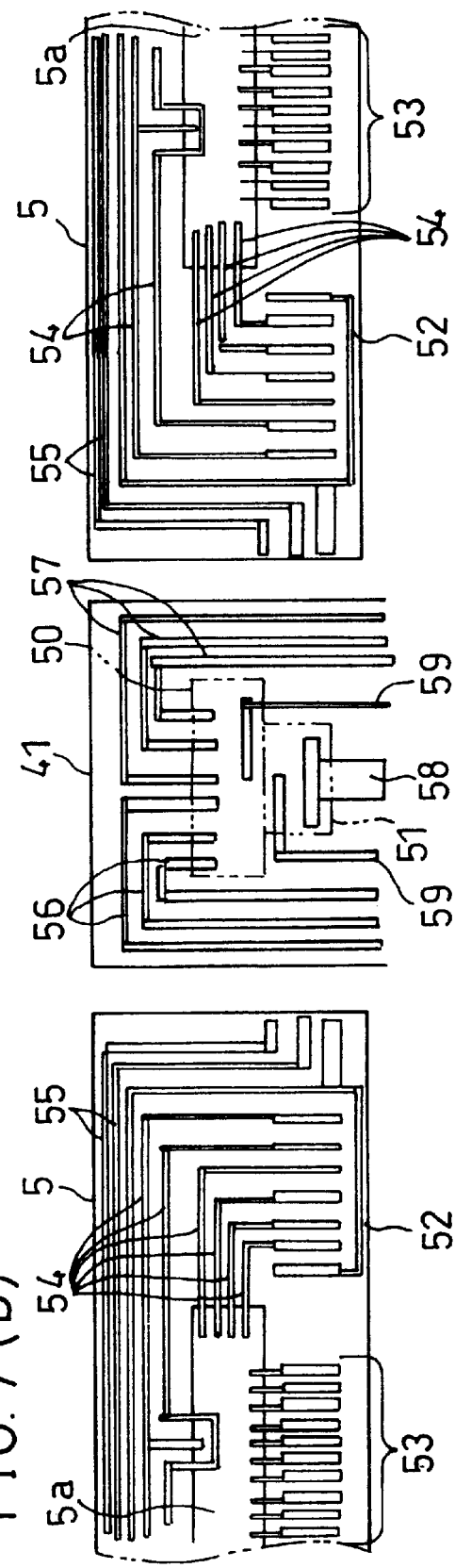
FIG. 7(a)
FIG. 7(b)

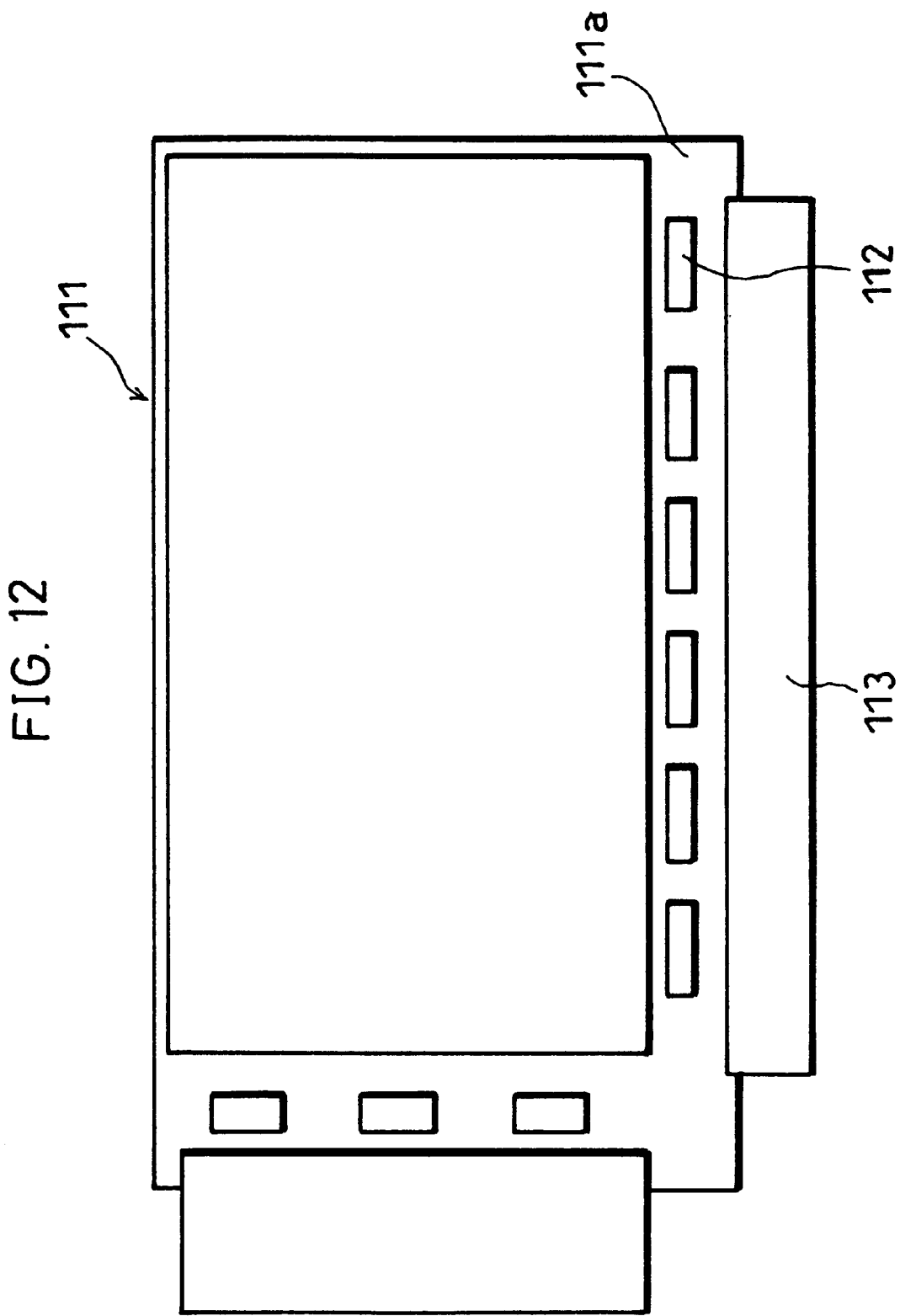

LIQUID CRYSTAL DISPLAY DEVICE

FIELD OF THE INVENTION

The present invention relates to a liquid crystal display device, in particular, to a packaging structure in which a liquid crystal display panel and a circuit substrate which supplies a drive voltage and a drive signal as liquid-crystal-drive signals are mounted to a liquid crystal display device.

BACKGROUND OF THE INVENTION

Conventionally, a TCP (tape carrier package) or COG (chip on glass) packaging technique is used to mount, to a liquid crystal display device, a liquid crystal panel and a circuit substrate, drive IC, etc. which supply a drive signal and a drive voltage as liquid-crystal-drive signals to the liquid crystal panel.

According to TCP packaging, as shown in FIG. 11, a liquid crystal panel 101 is connected to flexible substrates (hereinafter, will be referred to TCPs) 102 carrying a liquid crystal drive IC thereon, and receives a drive voltage and a drive signal from the liquid crystal drive IC mounted to the TCPs 102.

Each TCP 102 receives an external drive voltage and drive signal via the circuit substrate 103 connected to the TCP 102 opposite to the panel.

The circuit substrate 103 for use with a TCP technique requires numerous input signal lines to transmit the drive voltage and the drive signal to the TCPs 102. Therefore, the circuit substrate 103 is normally fabricated from a multilayer plate including four to eight conductor layers and measures 5 mm to 10 mm in width and 0.6 mm to 1 mm in thickness.

As described above, according to a TCP technique, numerous lines are needed to transmit the drive voltage and the drive signal to the TCPs 102 via the circuit substrate 103 for use with the liquid crystal display device; therefore, the circuit substrate 103 is either bulky, or compact but costly due to multilayer wiring or other special techniques involved.

Japanese Laid-Open Patent Application No. 8-146449/1996 (Tokukaihei 8-146449; published on Jun. 7, 1996) discloses another packaging structure, which is an application of a TCP technique. This packaging structure is similar to conventional TCP techniques in that there are provided TCPs in the peripheral part of a liquid crystal panel and also that flexible wiring substrates are lined along the outer edge of a row of TCPs. The distinction lies where the wires on the flexible wiring substrates and the wires on the TCPs are connected to each other in the gaps between the TCPs in this structure, while they are connected in the gaps between the flexible wiring substrates and the TCPs according to conventional techniques. This structure thus enables reduction in dimensions of the peripheral part (frame) of the liquid crystal panel.

The arrangement is equivalent to a packaging structure used in a conventional TCP technique, with an only change in the location of the area where the wires on the flexible wiring substrates and the wires on the TCPs are connected to each other. The disclosed structure therefore cannot reduce the number of wires formed on the flexible wiring substrates. Besides, the wires on the flexible wiring substrates need additional length, in comparison to conventional wires, so as to reach the gaps between the TCPs. If the flexible wiring substrates need to be further elongated to suit increased dimensions of the panel, the drive signal and the drive voltage are likely to deteriorate during transmission. The issue will be elaborated again later.

Meanwhile, according to a COG technique, as shown in FIG. 12, liquid crystal drive ICs 112 and circuit substrates 113 for supplying a drive voltage and a drive signal to the liquid crystal drive ICs 112 are disposed in the peripheral part of a glass substrate 111a constituting a liquid crystal panel 111.

As described above, according to a COG technique, the circuit substrate 113 supplies a drive voltage and a drive signal to the liquid crystal drive ICs 112; therefore, the circuit substrate 113 can be readily connected to the liquid crystal panel 111.

As mentioned earlier, packaging of panels, which are becoming increasingly larger, using a TCP technique cause the drive signal and the drive voltage to decay during transmission. The decay occurs because the drive signal and the drive voltage are provided externally and must be passed through an area (supply point) which is located, for example, near a corner of the liquid crystal panel on the flexible wiring substrate, before being applied to the TCPs via the wires on the wiring substrates. The longer distance the drive signal and the drive voltage need to propagate from the supply point to the TCPs, the further they decay. Such deterioration does not occur in a liquid crystal display device with an about 10-inch display under typical conditions. The drive signal, however, cannot be transmitted in a 15-inch or larger liquid crystal display device, because the distance grows between the TCPs located at both ends, and the resultant large resistance of the wires on the flexible wiring substrate causes a large voltage drop.

If the drive signal can be successfully transmitted to all the TCPs in a 15-inch or even larger liquid crystal display device, there is a further problem: the drive voltage is more likely to decay and more difficult to transmit properly than the drive signal. To address this problem, a separate circuit substrate becomes necessary to supply a drive voltage to TCPs. This inevitably requires more investment in manufacturing machines and results in higher manufacturing cost in the manufacture of liquid crystal display devices.

Meanwhile, according to the aforementioned COG technique, as shown in FIG. 12, the circuit substrate 113 supplies the drive voltage and the drive signal to the liquid crystal drive ICs 112. The circuit substrate 113 can be readily connected to the liquid crystal panel 111 in an about 10-inch liquid crystal display device. It can, however, be connected to them only with difficulties in a 15-inch or larger liquid crystal display device due to the increased dimensions of the circuit substrate 113.

Besides, in the COG technique, the liquid crystal drive IC 112 and the circuit substrates 113 are connected to the peripheral part of the liquid crystal panel 111. This structure increases the total dimensions of the liquid crystal display device only without ever contributing to an increase in the screen size.

SUMMARY OF THE INVENTION

To address these problems, the present invention has an object to offer a liquid crystal display device of such a packaging structure that a drive voltage can be supplied to TCPs without being affected adversely by a voltage drop caused by an increased resistance of wires despite a growth in size of a liquid crystal panel.

To achieve the object, a liquid crystal display device in accordance with the present invention includes a liquid crystal panel in which a liquid crystal is interposed between two substrates on which drive electrodes for driving the liquid crystal are provided, the liquid crystal panel including:

electrode-connecting-terminal sections (TCPs) each connected to a predetermined number of the drive electrodes and provided with drive means which is capable of driving the predetermined number of the drive electrodes; and a circuit substrate for supplying a liquid-crystal-drive signal to the electrode-connecting-terminal sections, wherein:

connecting wires are provided between a pair of adjacent electrode-connecting-terminal sections so as to transmit the signal supplied by the circuit substrate sequentially from one electrode-connecting-terminal section to a next; and stabilizer means is provided between at least a pair of adjacent electrode-connecting-terminal sections so as to stabilize the signal transmitted via the connecting wires.

According to the arrangement, stabilizer means is provided to stabilize the signal transmitted via the connecting wires connecting adjacent electrode-connecting-terminal sections. Therefore, the liquid crystal display device is not affected adversely by a voltage drop caused by an increased resistance of wires despite the increased dimensions of the liquid crystal panel and the resultant increased distance between electrode-connecting-terminal sections. In other words, a signal can be now supplied to the electrode-connecting-terminal sections without being seriously affected by a voltage drop caused by an increased resistance of wires despite the increased dimensions of the liquid crystal panel.

To achieve the object, another liquid crystal display device in accordance with the present invention includes a liquid crystal panel in which a liquid crystal is interposed between two substrates on which drive electrodes for driving the liquid crystal are provided, the liquid crystal panel comprising:

electrode-connecting-terminal sections each connected to a predetermined number of the drive electrodes and provided with drive means which is capable of driving the predetermined number of the drive electrodes; and a circuit substrate for supplying a drive signal and a drive voltage as liquid-crystal-drive signals to the electrode-connecting-terminal sections, wherein:

connecting wires are provided between a specific pair of adjacent electrode-connecting-terminal sections so as to transmit the drive signal and the drive voltage sequentially from one electrode-connecting-terminal section to a next; and stabilizer means is provided between at least a pair of adjacent electrode-connecting-terminal sections so as to stabilize the drive voltage transmitted via the connecting wires, and provides the drive voltage as the liquid-crystal-drive signal to two electrode-connecting-terminal sections which are immediately adjacent to the stabilizer means, and also, through transmission via the connecting wires, to the other electrode-connecting-terminal sections which are electrically connected to the stabilizer means.

According to the arrangement, the drive voltage as a liquid-crystal-drive signal is prevented from decaying, as it is supplied collectively. Under these circumstances, the stabilizer means may be disposed as far down as immediately before the drive voltage and the drive signal transmitted to the TCPs falls below a tolerable decay value. The stabilizer means may be provided in various numbers and positions depending on the dimensions of the liquid crystal display device and other factors; a larger panel increasingly requires the drive voltage to be supplied collectively by the use of the stabilizer means.

The present invention will become more fully understood from the detailed description given hereinbelow and the accompanying drawings which are given by way of illustration only, are not in any way intended to limit the scope of the claims of the present invention.

BRIEF DESCRIPTION OF THE DRAWINGS

FIG. 2(a) is a plan view schematically showing a structure to establish connection between source TCPs and flexible substrates, while

FIG. 7(a) is an explanatory view showing a packaging structure of source input TCPs in the liquid crystal display device shown in FIG. 6, while FIG. 7(b) is a plan view schematically showing the source TCPs and the source input TCPs shown in FIG. 7(a).

FIG. 8(a) is a plan view showing a structure of the cover lay which is formed to prevent the source input TCP from being disconnected, while FIG. 8(b) is a plan view showing a structure of the cover lay which is formed for the source input TCP as a comparative example for FIG. 8(a).

FIG. 12 is a plan view schematically showing a liquid crystal display device which is fabricated using a conventional COG technique.

DESCRIPTION OF THE EMBODIMENTS

Embodiment 1

The following description will discuss an embodiment in accordance with the present invention.

Figure 1:
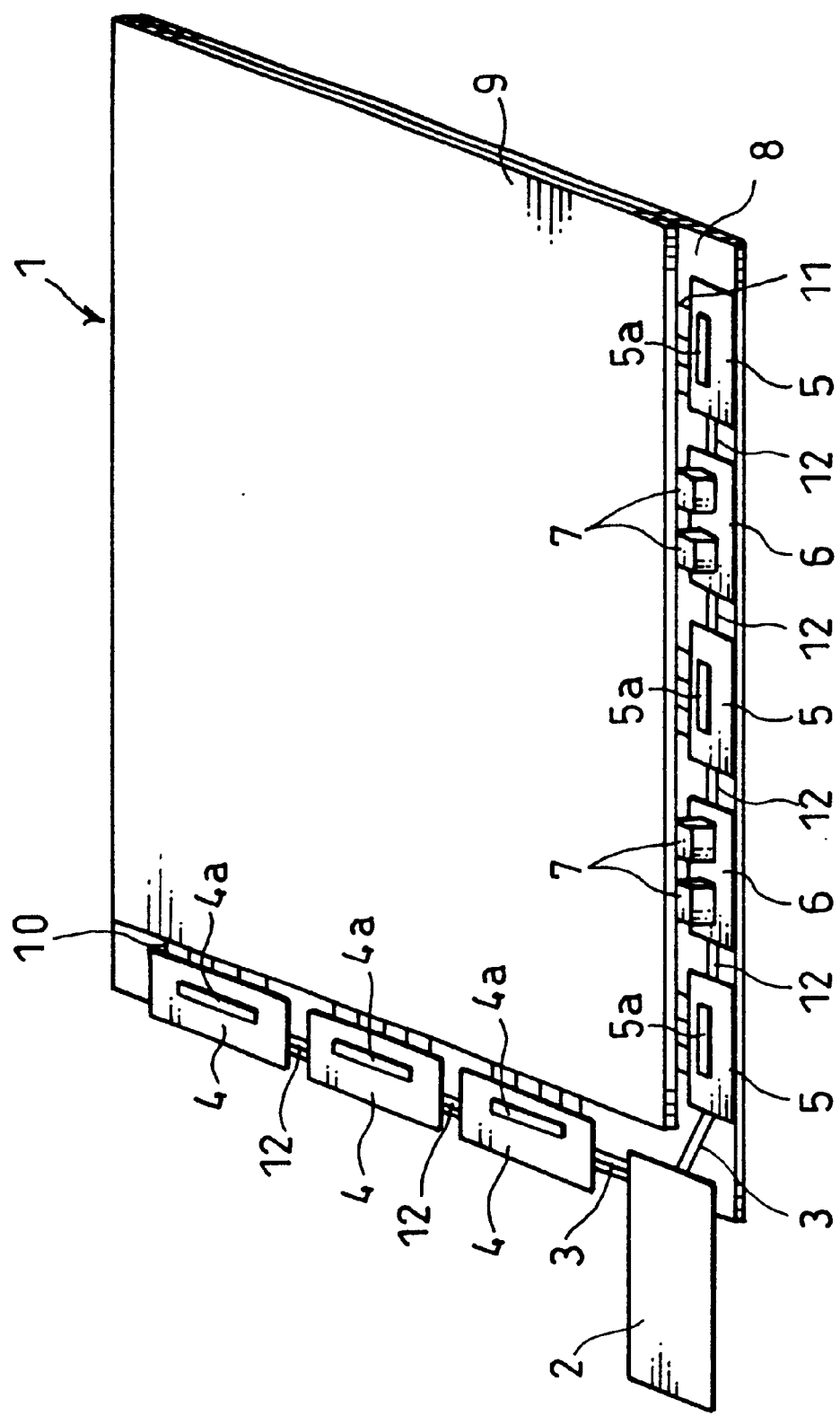
FIG. 1 is a perspective view schematically showing a liquid crystal display device of an embodiment in accordance with the present invention.

As shown in FIG. 1, a liquid crystal display device of the present embodiment includes: a liquid crystal panel 1 as a display element; a circuit substrate 2 for supplying to the liquid crystal panel 1 liquid-crystal-drive signals (hereinafter, will be simply referred to as signals), such as a drive voltage and a drive signal, which drives gate wires 10 and source wires 11 (these wires will be explained later in detail); and gate TCPs 4 and source TCPs 5 as electrode-connecting-terminal sections via which the circuit substrate 2 supplies signals to the liquid crystal panel 1.

The liquid-crystal-drive signal of the present invention does not refer only to those signals provided as inputs to drive ICs in the gate TCPs 4 and the source TCPs 5, but encompasses all the electrical signals that are supplied by the circuit substrate 2 to one of the gate TCPs 4 and to one of the source TCPs 5 and then transmitted sequentially from that gate TCP 4 to the next and from that source TCP 5 to the next via later-mentioned transmission panel wires 12. The "drive voltage" encompasses (1) a voltage (opposite voltage) which is directly applied to the liquid crystal panel 1 with no intervening drive IC, (2) a voltage (power source voltage) which is input to a drive IC to drive the drive IC, and (3) a GND voltage (GND potential) of the gate TCPs 4 and the source TCPs 5 connected by the transmission panel wires 12. Meanwhile, the "drive signal" encompasses signals (data signals and timing signals) which are input to the drive ICs in the gate TCPs 4 and the source TCPs 5 to control operations of the gate wires and the source wires (drive electrodes).

The liquid crystal panel 1 includes liquid crystal (not shown) interposed between an active matrix substrate 8 and an opposite substrate 9 and displays a desired image by changing orientation of the liquid crystal through application of voltage to the liquid crystal.

The active matrix substrate 8 includes pixel electrodes and thin film transistors (not shown) which are arranged to form a matrix. The pixel electrodes and the thin film transistors are connected to the gate wires 10 and the source wires 11 which serve as drive electrodes.

Opposite electrodes (not shown) are formed on the opposite substrate 9, opposing the pixel electrodes formed on the active matrix substrate 8.

The orientation of the liquid crystal sandwiched by the active matrix substrate 8 and the opposite substrate 9 is changed by applying a voltage across the pixel electrodes on the active matrix substrate 8 and the opposite electrodes on the opposite substrate 9. The application of a voltage is controlled using the gate wires 10 and the source wires 11.

The active matrix substrate 8 has a peripheral part extending external to the opposite substrate 9. In that peripheral part are provided a circuit substrate 2, gate TCPs 4, and source TCPs 5. The gate TCPs 4 and the source TCPs 5 are lined up side by side along two adjacent sides of the active matrix substrate 8 to form a row of gate TCPs and a row of source TCPs respectively. The circuit substrate 2 is disposed on the corner where the two adjacent sides cross each other.

Each gate TCP 4 is coupled to a predetermined number of gate wires 10 and electrically connected to adjacent gate TCPs 4 via the transmission panel wires 12. The gate TCP 4 located nearest to the circuit substrate 2 is electrically connected to the circuit substrate 2 via wires 3.

Each gate TCP 4 is provided with a drive IC 4a as drive means to address the gate wires 10 according to a drive signal from the circuit substrate 2. The drive IC 4a is electrically connected at its terminal sections (not shown) to the gate wires 10 and the transmission panel wires 12.

Thus, a signal supplied by the circuit substrate 2 to the gate TCP 4 which is directly connected to the circuit substrate 2 via the wires 3 is sequentially transmitted from a gate TCP 4 to the next along the row before reaching the last gate TCP 4. The drive IC 4a disposed on each gate TCP 4 addresses the corresponding gate wires 10.

Each source TCP 5 is coupled to a predetermined number of source wires 11 and electrically connected to adjacent source TCPs 5 via the transmission panel wires 12. The source TCP 5 located nearest to the circuit substrate 2 is electrically connected to the circuit substrate 2 via wires 3.

Each source TCP 5 is provided with a drive IC 5a as drive means to address the source wires 11 according to a drive signal from the circuit substrate 2. The drive IC 5a is electrically connected at its terminal sections (not shown) to the source wires 11 and the transmission panel wires 12.

Thus, signals transmitted from the circuit substrate 2 to the source TCP 5 which is directly connected to the circuit substrate 2 via the wires 3 are sequentially transmitted from a source TCP 5 to the next along the row before reaching the last source TCP 5. The drive IC 5a disposed on each source TCP 5 addresses the corresponding source wires 11.

As mentioned above, the transmission panel wires 12 are provided so as to establish electrical connection between adjacent gate TCPs 4 and also between adjacent source TCPs 5. Description will be given later in detail about the connecting structure of the transmission panel wires 12.

If a liquid crystal panel 1 measuring 15 inches or larger is incorporated in a liquid crystal display device arranged as in the foregoing, without providing TCPs in greater numbers to match the increased panel dimensions, the distance grows between adjacent gate TCPs 4 and also between adjacent source TCPs 5 around the liquid crystal panel 1, and the signal supplied by the circuit substrate 2 to the gate TCPs 4 and the source TCPs 5 decays as it propagates further down; this will result in a poorer display performance.

Accordingly, in the present embodiment, a flexible substrate (stabilizer means) 6 is provided between every pair of adjacent source TCPs 5, which are disposed along a longer side of the liquid crystal panel 1, so as to stabilize the signal transmitted via the transmission panel wires 12 as shown in FIG. 1.

The flexible substrate 6 carries an electronic assembly 7 mounted thereto to adjust the magnitude of the liquid-crystal-drive signal and voltage (i.e., the drive signal and the drive voltage). The electronic assembly 7 is electrically connected to the transmission panel wires 12. The electronic assembly 7 suitably includes, for example, chip capacitors, chip resistors, chip transformers, and regulators.

The electronic assembly 7 includes, for example, a chip capacitor mounted to the $V_{cc}$ or $V_{LS}$ wire of the flexible substrate 6 so as to limit voltage variations in the transmission panel wires 12. Alternatively, the electronic assembly 7 may include a regulator mounted to the $V_{cc}$ or $V_{LS}$ wire of the flexible substrate 6 so as to change input voltage (from 5 V to 3.3 V for example) before providing it to a next source TCP 5.

Figure 2A:
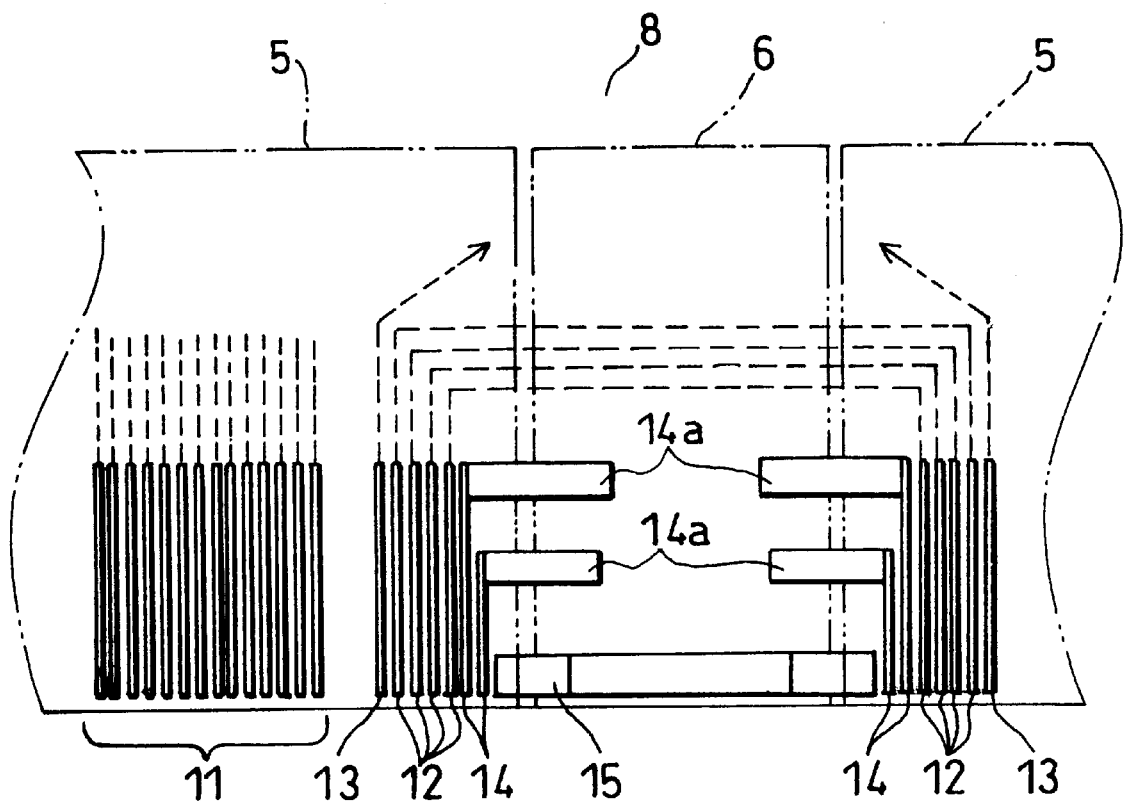
Figure 2B:
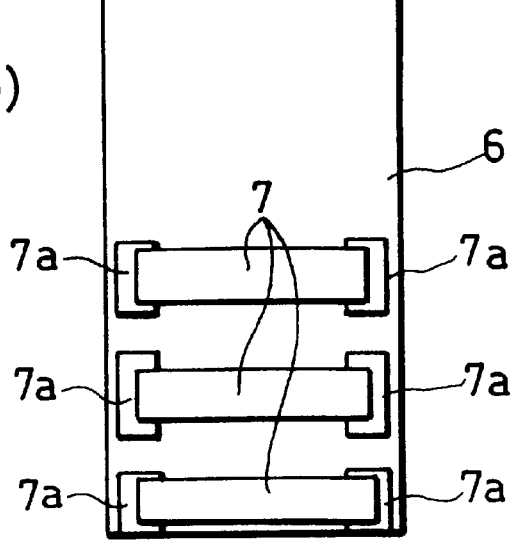
FIG. 2(b) is a plan view schematically showing one of the flexible substrates shown in FIG. 2(a).

Now, referring to FIGS. 2(a) and 2(b), the following description will discuss a structure connecting the flexible substrate 6 to the source TCPs 5.

As shown in FIG. 2(a), the source wires 11 and the transmission panel wires 12, as well as opposite electrode wires 13, power source wires 14, and a common wire 15, are formed on each part of the active matrix substrate 8 where a source TCP 5 will be disposed.

The transmission panel wires 12 and the common wires 15 are extended to reach two parts of the active matrix substrate 8 where two source TCPs 5 will be disposed adjacent to a flexible substrate 6.

Power source terminals 14a for the power source wires 14 are formed on a part of the active matrix substrate 8 where a flexible substrate 6 will be disposed.

The flexible substrate 6 carries three electronic components, constituting the assembly 7, provided in parallel to each other as shown in FIG. 2(b). Two of the three electronic components are connected by terminal sections 7a to the power source terminals 14a of the power source wires 14 shown in FIG. 2(a). The remaining electronic component is connected to via another terminal section 7a to the common wire 15 shown in FIG. 2(a).

The structure allows signals to be transmitted from a source TCP 5 to the next via the power source wires 14 and the common wire 15 which are provided in parallel to each other, in addition to the transmission panel wires 12, between the source TCPs 5, and thus reduces the resistance in the transmission.

In the liquid crystal display device arranged as in the foregoing, a flexible substrate (stabilizer means) 6 is disposed between every pair of adjacent source TCPs 5 to stabilize signals transmitted via the transmission panel wires 12; therefore, the liquid crystal display device is not affected adversely by a voltage drop caused by an increased resistance of wires despite the increased dimensions of the liquid crystal panel 1 and the resultant increased distance between source TCPs 5. In other words, drive voltage can be now supplied to the source TCPs 5 without being affected adversely by a voltage drop caused by an increased resistance of wires despite increased dimensions of the liquid crystal panel 1.

Accordingly, the present invention can dispense with circuit substrates, unlike a conventional technique whereby they are essential to supply a stable drive voltage to the source TCPs 5 in a large-size liquid crystal panel 1.

The omission of the circuit substrates from the manufacturing process of the liquid crystal display device greatly reduces steps to mount various members to the liquid crystal panel 1. More positive results are expected, including reductions in investment in mounting machines, manufacturing steps, and workers attending to the manufacturing line.

Note that FIG. 1 and FIG. 2 show an example in which the flexible substrates 6 are disposed between the source TCPs 5. Alternatively, the flexible substrates 6 may be disposed between the gate TCPs 4.

Accordingly, the stabilizer means (flexible substrates 6) may be disposed, if necessary, either between the gate TCPs 4 or between the source TCPs 5 or both depending on the likelihood of a voltage drop being caused by the resistance of wires.

Further, in the liquid crystal display device arranged as in the foregoing, the gate TCPs 4 and the source TCPs 5 (hereinafter, these two kinds of TCPs will be collectively referred to simply as TCPs where convenient) are disposed directly on the active matrix substrate 8 of the liquid crystal panel 1. Therefore, printed wiring substrates, which would be necessary in a packaging structure of a conventional liquid crystal panel, are not included.

Figure 3:
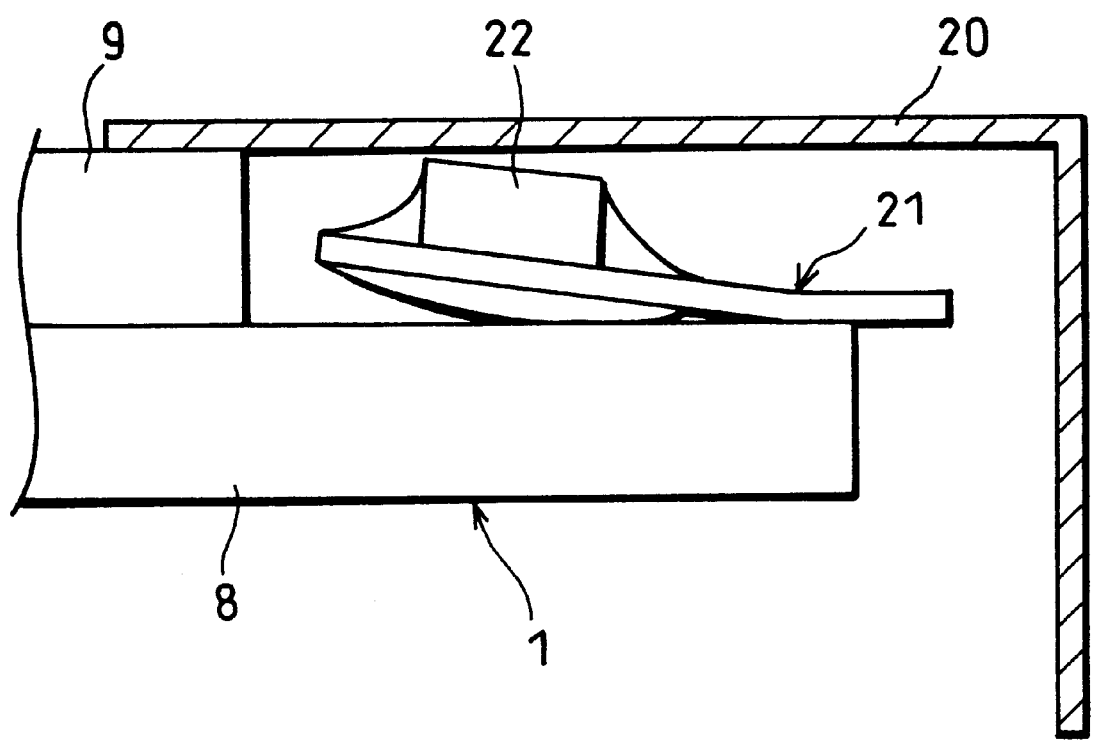
FIG. 3 is an explanatory view showing, as an example, a packaging structure of TCPs which are provided in the peripheral part of the liquid crystal panel in accordance with the present invention.

As shown in FIG. 3, bezels 20 are provided in the peripheral part of the liquid crystal panel 1 so as to cover the TCPs 21 on the active matrix substrate 8. The size of the space formed between the bezel 20 and the active matrix substrate 8 varies depending on the thickness of the liquid crystal panel 1, especially, on the thickness of the opposite substrate 9.

If a conventional TCP is used in a liquid crystal panel 1 which, as in the present embodiment, includes no printed wiring substrate, the drive IC on the TCP contacts or pushes up the bezel 20 covering the peripheral part of the liquid crystal panel 1 depending on the space between the bezel 20 and the active matrix substrate 8, obstructing proper disposition of the bezel 20.

Accordingly, it is suggested to accommodate the drive IC 22, which is on the TCP 21, in the space between the bezel 20 and the active matrix substrate 8 by reducing its thickness as shown in FIG. 3.

However, in general, the thickness of the drive IC 22 provided on the TCP 21 can be reduced only with difficulties and at high cost.

We give a solution to this problem using conventional TCPs, which will be explained in the following in reference to FIG. 4.

Figure 4:
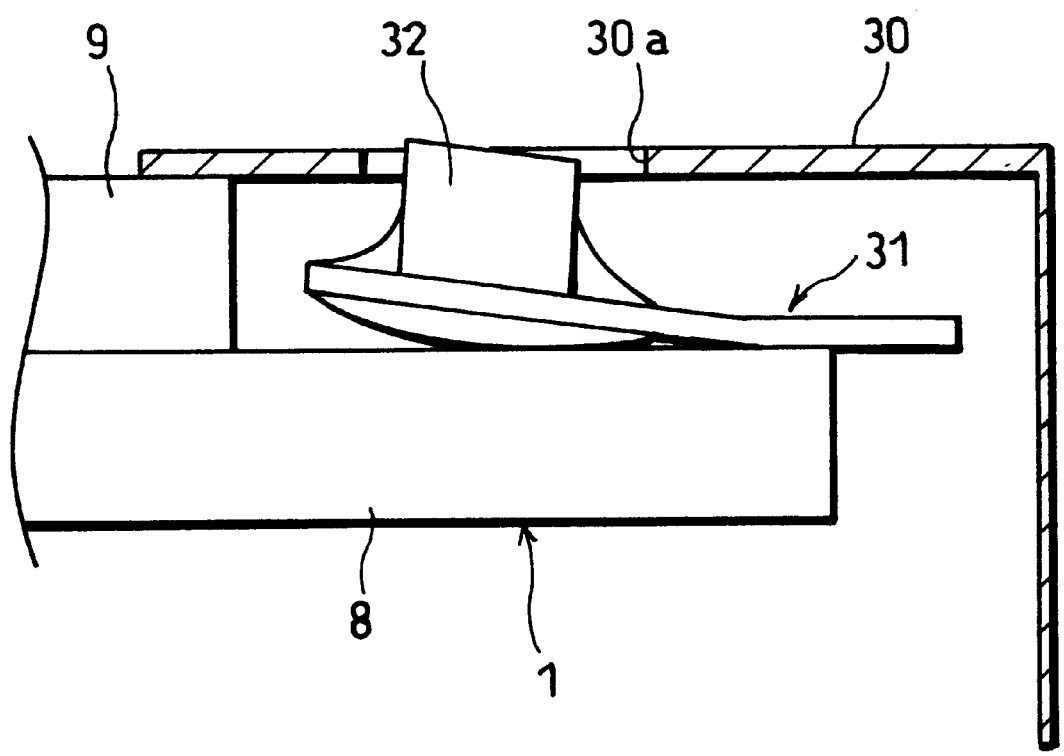
FIG. 4 is an explanatory view showing, as another example, a packaging structure of TCPs which are provided in the peripheral part of the liquid crystal panel in accordance with the present invention.

In an example shown in FIG. 4, an aperture 30a is formed in the top surface of a bezel 30, allowing the upper part of a drive IC 32 provided on a TCP 31 to stick out of the aperture 30a. The structure does not require reduction of the thickness of the drive IC 32 and allows a conventional TCP 31 with a relatively thick drive IC. Manufacturing cost of the liquid crystal display device is thus reduced.

If the liquid crystal panel 1 is to be housed in a housing (not shown) of the liquid crystal display device, it is preferable that the drive IC 32 has as little protrusion sticking out of the aperture 30a of the bezel 30 as possible so that the drive IC 32 does not contact the housing.

If the flexible substrates 6 are used as stabilizer means as in the foregoing, drive voltage can be transmitted directly from the external substrate to the liquid crystal panel 1 with a low resistance via a far smaller number of wires than in conventional cases. Besides, the TCP and the flexible substrates 6 can be readily connected to the liquid crystal panel 1 using a conventional ACF connecting technique.

Instead of providing flexible substrates 6 as stabilizer means, jumper lines may be directly connected to the liquid crystal panel 1 for example. Alternatively, the bezel may be connected to ground so as to establish direct connection with the ground terminal of the liquid crystal panel 1. A further alternative is to adapt a chip component so that they stick out of a nearby substrate and to connect the edge of the chip onto the liquid crystal panel 1.

Figure 5:
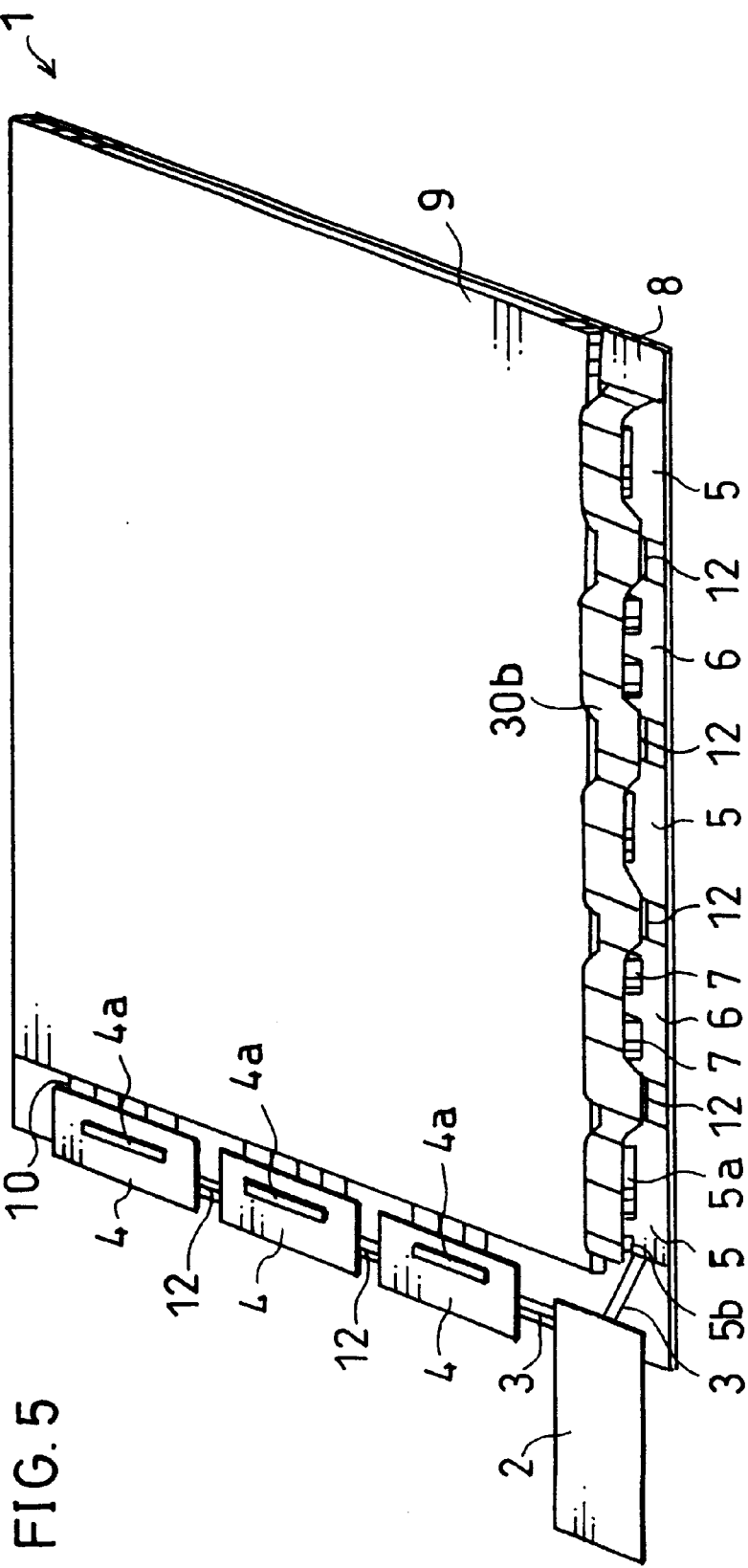
FIG. 5 is a perspective view schematically showing a structure in which a metal plate is attached to reinforce a GND line in the liquid crystal display device shown in FIG. 1.

The following description will discuss an alternative way of constructing the stabilizer means, taking as an example the bezel being connected to ground so as to establish direct connection with the ground terminal of the liquid crystal panel 1. In this structure, as shown in FIG. 5, an elongated metal plate (GND electrode, or earth link) 30b is secured to a bezel (not shown) so as to be positioned flanked by the bezel on one side and the source TCPs 5, flexible substrates 6, etc. on the other. The metal plate 30b is elevated partly toward the bezel where it is opposite to the drive ICs 5a which is disposed on the source TCPs 5 and the electronic assembly 7 which is disposed on the flexible substrates 6, so as not to contact the drive ICs 5a and the electronic assembly 7, taking a wave-like form as a whole. The metal plate 30b is adapted to contact GND pads (ground pads or ground terminals; not shown) where the metal plate 30b is lowered, each pad being disposed on the liquid crystal panel (active matrix substrate 8) in a gap between source TCPs 5. The structure sets the GND pads between the source TCPs 5 to a common potential and is thereby capable of enhancing the function of the GND line (stabilizing the GND potential).

Accordingly, the structure further stabilizes the driving of the liquid crystal panel 1 even when the resistance of wires between source TCPs is not sufficiently reduced. Notable positive effects are expected from the structure especially when the resistance of wires between source TCPs increases with an increased size of the panel and also when drive frequency increases with improvement in image quality. Needless to say, alternatively, the metal plate (GND electrode or earth) 30b may be disposed so as to contact the GND pads provided between the gate TCPs 4 which form a row of gate TCPs.

Apart from the present embodiment, there are other techniques to stabilize the transmission of drive voltage and drive signal over the transmission panel wires 12 between the TCPs. Taking account of a drop which occurs to the drive voltage applied to the gate TCPs 4 or source TCPs 5, the circuit substrate 2 may apply a relatively high drive voltage to the first gate TCP 4 or source TCP 5. For example, if the drive voltage of the liquid crystal panel 1 is 3.3 V, a 4-V input, which is higher than 3.3 V is provided to the first gate TCP 4 or source TCP 5.

Specifically, a regulator is mounted to the circuit substrate 2, and a secondary drive line is provided branching off the drive line in the circuit substrate 2. One of the lines is used to apply the drive voltage of 4 V to the subsequent source TCP 5 without modifying the voltage, while the other line is used to apply the drive voltage to the subsequent gate TCP 4 only after the regulator drops the voltage down to 3.3 V.

If the circuit substrate 2 controls the drive voltage so as to compensate for a drop which occurs to the drive voltage before it is applied to the gate TCPs 4 and the source TCPs 5, there is no longer a need to provide the flexible substrates 6 shown in FIG. 1 and FIG. 2. In such an event, the circuit substrate 2 serves as stabilizer means to stabilize the drive voltage and the drive signal.

An example will be discussed in embodiment 2 immediately below, in which, as in the foregoing, the circuit substrate 2 which applies the drive voltage and the drive signal to the liquid crystal panel 1 doubles as stabilizer means to stabilize the drive voltage and the drive signal transmitted via the transmission panel wires 12 like the flexible substrates 6.

Embodiment 2

Now another embodiment will be discussed in accordance with the present invention. For convenience, members of the present embodiment that have the same arrangement and function as members of the first embodiment, and that are mentioned in the first embodiment are indicated by the same reference numerals and description thereof is omitted.

Figure 6:
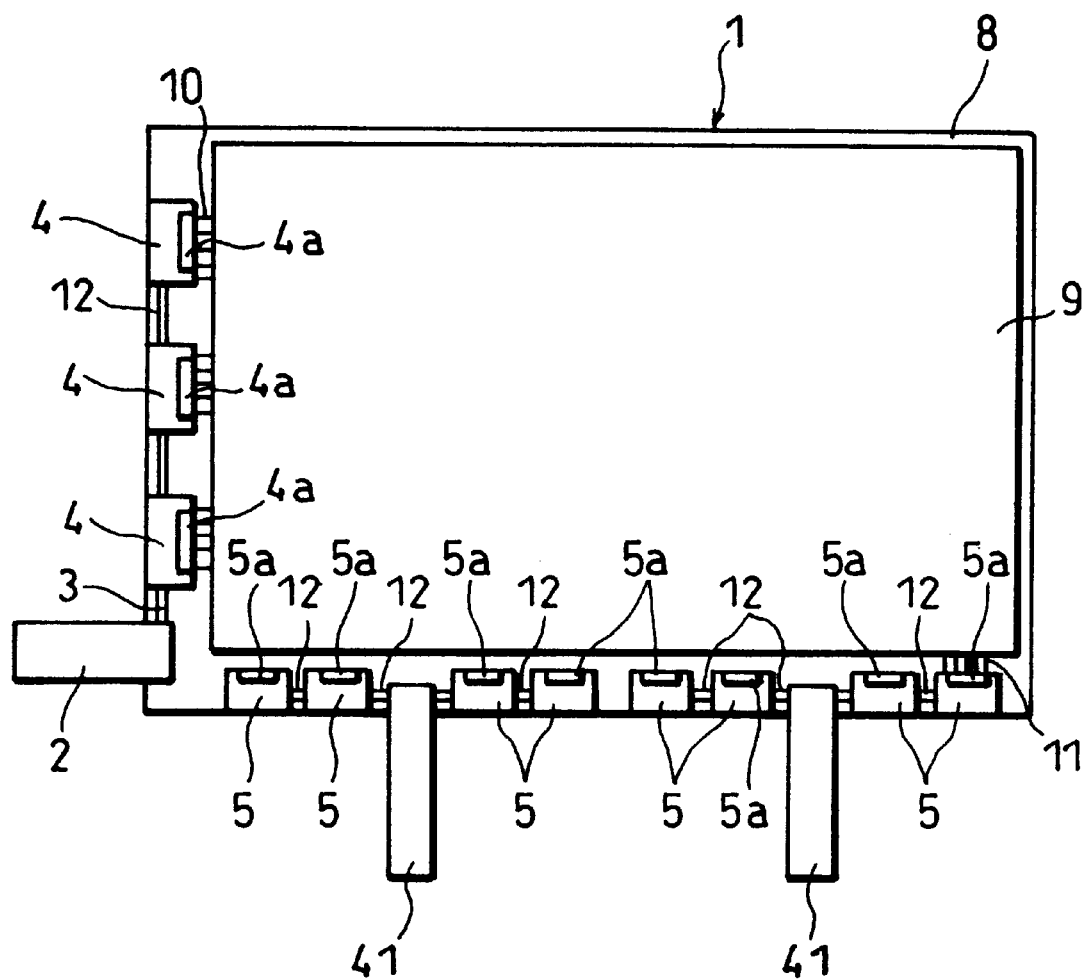
FIG. 6 is a plan view schematically showing a liquid crystal display device of another embodiment in accordance with the present invention.

A liquid crystal display device of the present embodiment differs from the aforementioned liquid crystal display device of embodiment 1 in that source input TCPs 41 are provided as stabilizer means between source TCPs 5 as shown in FIG. 6 to replace the flexible substrates 6 shown in FIG. 1 of embodiment 1 and also that a circuit substrate 2 is electrically connected only to gate TCPs 4 via wires 3.

A drive IC 4a is mounted to each gate TCP 4 and electrically connected at its terminal section (not shown) to gate wires 10 formed on an active matrix substrate 8.

The gate TCP 4 located at one end is electrically connected via wires 3 to the circuit substrate 2. Unlike embodiment 1, the circuit substrate 2 is adopted to supply, only to the gate TCPs 4, the drive voltage and the drive signal which will be eventually applied to the gate wires 10.

The gate TCPs 4 are connected in series with each other via transmission panel wires 12. A signal is transmitted from the circuit substrate 2, located at one end, to the next gate TCP 4 via wires 3, then sequentially from that TCP 4 to the next.

Meanwhile, a drive IC 5a is mounted to each gate TCP 5 and electrically connected at its terminal section (not shown) to source wires 11 formed on the active matrix substrate 8.

The source TCPs 5 are placed in a row and electrically connected in series with each other via transmission panel wires 12. A source input TCP 41 is disposed between source TCPs 5 at every predetermined interval on the transmission panel wires 12.

Each source input TCP 41 is adopted to be electrically connected to its adjacent source TCPs 5 and supplies, to these two source TCPs 5, the drive voltage and the drive signal which will be eventually applied to the source wires 11.

The drive voltage and the drive signal supplied to the source TCPs 5 decay as they propagate further. Accordingly, the source input TCPs 41 should be adapted so that the drive voltage and drive signal can be transmitted down to the last source TCP 5 in the row before they decay significantly and fail to drive the liquid crystal panel 1, that is, fall below a tolerable decay value. For these reasons, as shown in FIG. 6, a limited number of source TCPs 5 are connected in series with each other via transmission panel wires 12 so that a source input TCP 41 can supply the drive voltage and the drive signal with no intolerable decay. Accordingly, these source TCPs 5 are electrically connected to none of the other source TCPs 5 which receives the drive voltage and the drive signal from another source input TCP 41.

Therefore, the number and positions of the source input TCPs 41 are determined depending on the dimensions and resolution of the liquid crystal panel 1, as well as on the tolerable decay values of the drive voltage and the drive signal for the liquid crystal panel 1.

Now, referring to FIGS. 7(*a*) and 7(*b*), the following description will discuss the structure which connects source TCPs 5 to a source input TCP 41.

As shown in FIG. 7(*a*), various wires are provided on the active matrix substrate 8 to connect to source TCPs 5, extending both to the right and left of a part of the active matrix substrate 8 in which a source input TCP 41 will be disposed. More wires are provided on a part of the active matrix substrate 8 in which the source input TCP 41 will be disposed, so as to connect to the source input TCP 41.

Specifically, first and second groups of source TCPs 5 will be disposed to the right and left, or vice versa, of a part of the active matrix substrate 8 in which a source input TCP 41 will be disposed. In the area in which the first group of source TCPs 5 will be disposed, there are provided source wires 11, common wire 42, first wires 43, second wires 44, power source wires 48, and an opposite electrode wire 49.

The common wire 42, the first wires 43, and the power source wires 48 extend across the part of the active matrix substrate 8 in which the source input TCP 41 will be disposed, reaching the second group of source TCPs 5 which will be disposed in the opposite side of the part.

Apart from the common wire 42, the first wires 43, and the power source wires 48, more source wires 11, another opposite electrode wire 49, and third wires 45 are also provided in the opposite side of the part in which the second group of source TCPs 5 will be disposed.

Therefore, the common wire 42, the first wires 43, the second wires 44, the third wires 45, and the power source wires 48 are formed in the part of the active matrix substrate 8 in which the source input TCP 41 will be disposed.

Extending from the area in which the first group of source TCPs 5 will be disposed to the area in which the second group of source TCPs 5 will be disposed, the first wires 43 functions as transmission panel wires to transmit the drive voltage and the drive signal between the two groups of source TCPs 5.

The second wires 44 transmit the drive voltage and the drive signal from the source input TCP 41 to one of the groups of source TCPs 5 which are disposed opposite to each other across the source input TCP 41. The third wires 45 transmit the drive voltage and the drive signal from the source input TCP 41 to the other group of source TCPs 5, to which the second wires 44 do not transmit the drive voltage and the drive signal.

As shown in FIG. 7(b), on the source input TCP 41 are formed: first signal supply wires 56 and second signal supply wires 57 via which the drive voltage and the drive signal are supplied by a drive source (not shown) to the source TCPs 5; common wire 58; and power source wires 59 via which power source voltage (power source) is supplied to the source TCPs 5.

Specifically, when a source input TCP 41 is mounted to an active matrix substrate 8, in a first connecting section 50 of the source input TCP 41, the first signal supply wires 56 and the second signal supply wires 57 are connected respectively to the second wires 44 and the third wires 45 which are formed on the active matrix substrate 8, so as to transmit the drive voltage and the drive signal to the second wires 44 and the third wires 45.

Further in the first connecting section 50 of the source input TCP 41, one of two power source wires 59 is connected to one of two power source wires 48 which are formed on the active matrix substrate 8.

In a second connecting section 51 of the source input TCP 41, the other power source wire 59 is connected to the other power source wire 48 which is formed on the active matrix substrate 8, and the common wire 58 is connected to the common wire 42 which is formed on the active matrix substrate 8.

As shown in FIG. 7(b), each source TCP 5 includes thereon: an opposite electrode wire 52, signal output wires 53 and transmission wires 54 connected to the drive IC 5a; and power source wires 55.

Accordingly, when the source TCP 5 is mounted to the active matrix substrate 8, the opposite electrode wire 52 on the source TCP 5 is connected to the common wire 42, as well as to the opposite electrode wire 49 on the active matrix substrate 8.

The power source wires 48 formed on the active matrix substrate 8 are connected to the power source wires 55, establishing paths for the power source voltage to flow from the source input TCP 41 to the power source wires 55 via the power source wires 48.

The transmission wires 54 for the first group of source TCPs 5 are connected to the first wires 43 and the second wires 44 which are formed on the active matrix substrate 8, establishing paths for the drive voltage and the drive signal to flow from the source input TCP 41 to the drive IC 5a via the first signal supply wires 56, the second wires 44, and the transmission wires 54.

The transmission wires 54 for the second group of source TCPs 5 are connected to the first wires 43 and the third wires 45 which are formed on the active matrix substrate 8, establishing paths for the drive voltage and the drive signal to flow from the source input TCP 41 to the drive IC 5a via the second signal supply wires 57, the third wires 45, and the transmission wires 54.

Further, the signal output wires 53 formed on each source TCP 5 transmit signals from the drive IC 5a to the source wires 11 formed on the active matrix substrate 8. Under these circumstances, the drive IC 5a is controlled by the drive voltage and the drive signal received via the transmission wires 54, so as to selectively transmit signals via the signal output wires 53 as required.

As detailed above, in the liquid crystal display device arranged as in the foregoing, more than one source input TCP 41 are provided to allow the liquid crystal panel 1 to receive the drive voltage and the drive signal via a plurality of paths. Therefore, the drive voltage and the drive signal, when received by the source TCPs 5, have values which are larger than the respective tolerable decay values. In other words, each source input TCP 41 as stabilizer means is placed at a predetermined position along a row of electrode-connecting-terminal sections (a row of source TCPs) constituted by a plurality of source TCPs 5, i.e., in a gap between two predetermined source TCPs 5. The structure allows a voltage (drive voltage) and a signal (drive signal) to be supplied, for the purpose of driving the liquid crystal, to the two source TCPs 5 and then sequentially to other source TCPs 5 which are connected to these two source TCPs 5 via connecting wires (source-drive-voltage supply wires and source-drive-signal supply wires). The structure also enables two source TCPs 5 located at the ends of rows of source TCPs 5 that are electrically connected to a common source input TCP 41 to receive a drive voltage and a drive signal having values which are larger than their respective tolerable decay values.

Therefore, the drive voltage and the drive signal do not decay significantly due to an increased resistance of wires before they are supplied to the source TCPs 5, despite increased dimensions of the liquid crystal panel 1 and resultant greater separations between source TCPs 5.

Figure 8A:
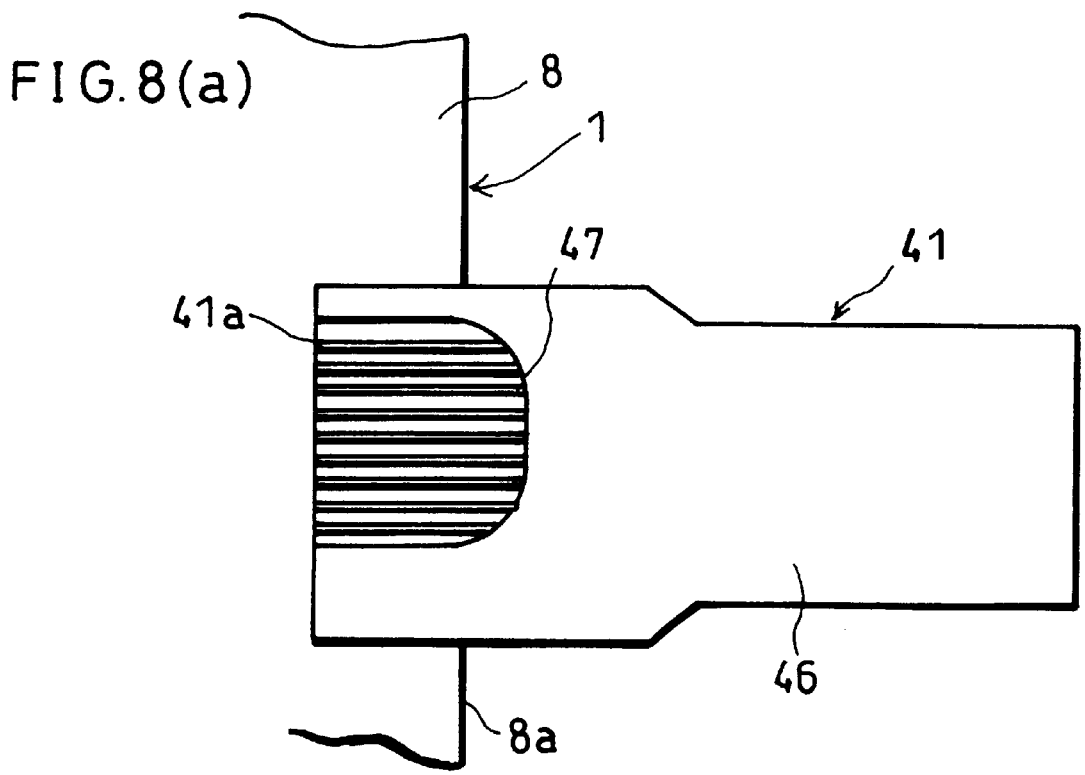
FIG. 8(a) and FIG. 8(b) are explanatory views showing formation of a cover lay on one of the source input TCPs in the liquid crystal display device shown in FIG. 6.
Figure 8B:
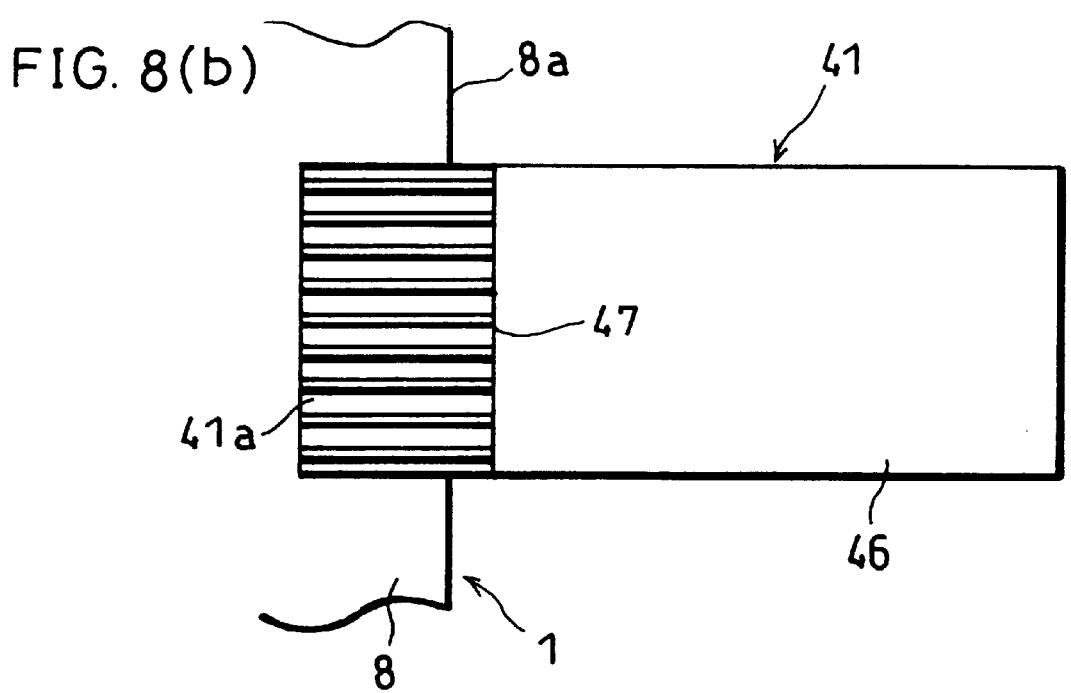

The source input TCP 41 is fabricated from a flexible substrate, as shown in FIGS. 8(a) and 8(b), with its conducting portion, except a connecting terminal section 41a, being covered with a cover lay 46 for insulation and physical protection.

Normally, the connecting terminal section 41a of the source input TCP 41 has about the same width as that of the source input TCP 41 as shown in FIG. 8 (b); therefore, the cover lay 46 is not formed on a portion of the source input TCP 41 where the source input TCP 41 is placed overlapping the active matrix substrate 8. Under these circumstances, the boarder 47 separating the cover lay 46 from the connecting terminal section 41a forms a straight line in parallel to the side surface 8a of the active matrix substrate 8.

The cover lay 46 is composed of an insulating resin, and has more hardness, and is less pliable, than the source input TCP 41 fabricated from a flexible substrate. Therefore, the source input TCP 41 (with a cover lay 46 being formed thereon) exhibits hardness and pliability that notably change at the boarder 47 which separates the cover lay 46 from the connecting terminal section 41a, and increases the likelihood of disconnections developing at the boarder 47.

Accordingly, the width of the connecting terminal section 41a is narrowed down below the width of the source input TCP 41, as shown in FIG. 8(a), so that the cover lay 46 can be extended to cover the portion of the source input TCP 41 where the source input TCP 41 is placed overlapping the active matrix substrate 8. The boarder 47 separating the cover lay 46 from the connecting terminal section 41*a*, at its both ends, is perpendicular to the side surface 8*a* of the active matrix substrate 8.

In this manner, the cover lay 46 shown in FIG. 8(*a*), if shaped as shown in FIG. 8(*b*), covers a substantial entirety of the source input TCP 41 and prevents disconnections from developing close to the boarder 47.

Besides, according to conventional COG techniques, flexible substrates must have contacts external to the drive ICs. In contrast, according to the present invention, flexible substrates have contacts between TCPs to which drive ICs are mounted, allowing a reduction in the width of terminals.

Further, according to conventional COG techniques, input signals must be supplied to all the drive ICs via flexible substrates. In contrast, in the present invention, an input signal and a signal for use with opposite electrodes need to be supplied only to drive ICs on specified TCPs.

In the present embodiment, an explanation has been given to an arrangement shown in FIG. 6 in which the circuit substrate 2 supplies a drive voltage and a drive signal only to the aforementioned gate TCP 4, whereas the source input TCP 41 supplies a drive voltage and a drive signal to the adjacent source TCPs 5.

Incidentally, in a liquid crystal display device with a larger panel, the drive signal is more likely to decay than the drive voltage. Accordingly, the liquid crystal display device shown in FIG. 6 may be modified to be more suited to a larger panel: the drive voltage is supplied collectively.

For example, changes may be made in FIG. 6, so that the drive voltage and the signal voltage supplied by the circuit substrate 2 to the gate wires 10 are supplied via the gate TCPs 4 and that the drive voltage and the signal voltage supplied by the circuit substrate 2 to the source wires 11 via the source TCPs 5. In FIG. 6, the lines are omitted which connect the circuit substrate 2 to the source TCPs 5.

The source input TCP 41 as stabilizer means supplies only a drive voltage and is placed along the row of source TCPs 5 immediately before the drive voltage supplied by the circuit substrate 2 falls below a tolerable decay value.

In this arrangement, the circuit substrate 2 supplies the drive voltage and the drive signal, and the source input TCP 41 supplies only the drive voltage. Specifically, the circuit substrate 2 is located along the outer edges of the row of gate TCPs 4 and the row of source TCPs 5 to supply the drive voltage and the drive signal to the rows of TCPs. Meanwhile, one or more source input TCPs 41 are provided between source TCPs 5 to provide a drive voltage to their adjacent source TCPs 5 respectively. In other words, each source input TCP 41 as stabilizer means is placed at a predetermined position along a row of electrode-connecting-terminal sections (a row of source TCPs) constituted by a plurality of source TCPs 5, i.e., in a gap between two predetermined source TCPs 5. The structure allows a voltage to be supplied, for the purpose of driving the liquid crystal, to the two source TCPs 5 and also to more source TCPs 5 which are connected to these two source TCPs 5 via source-drive-voltage supply wires. The structure also enables two source TCPs 5 located at the ends of rows of source TCPs 5 that are electrically connected to a common source input TCP 41 to receive a drive voltage having a value which is larger than its tolerable decay value. The source input TCPs 41 disposed along the row of source TCPs are not limited in terms of number in any especial manner: there may be only one source input TCP 41 or two or more of them.

By collectively supplying the drive voltage as explained here, the source input TCP 41 has a simplified circuit arrangement compared to a case where the drive voltage and the drive signal are divisionally and collectively supplied. The arrangement of the liquid crystal display device as a whole is thus simplified.

Figure 9:
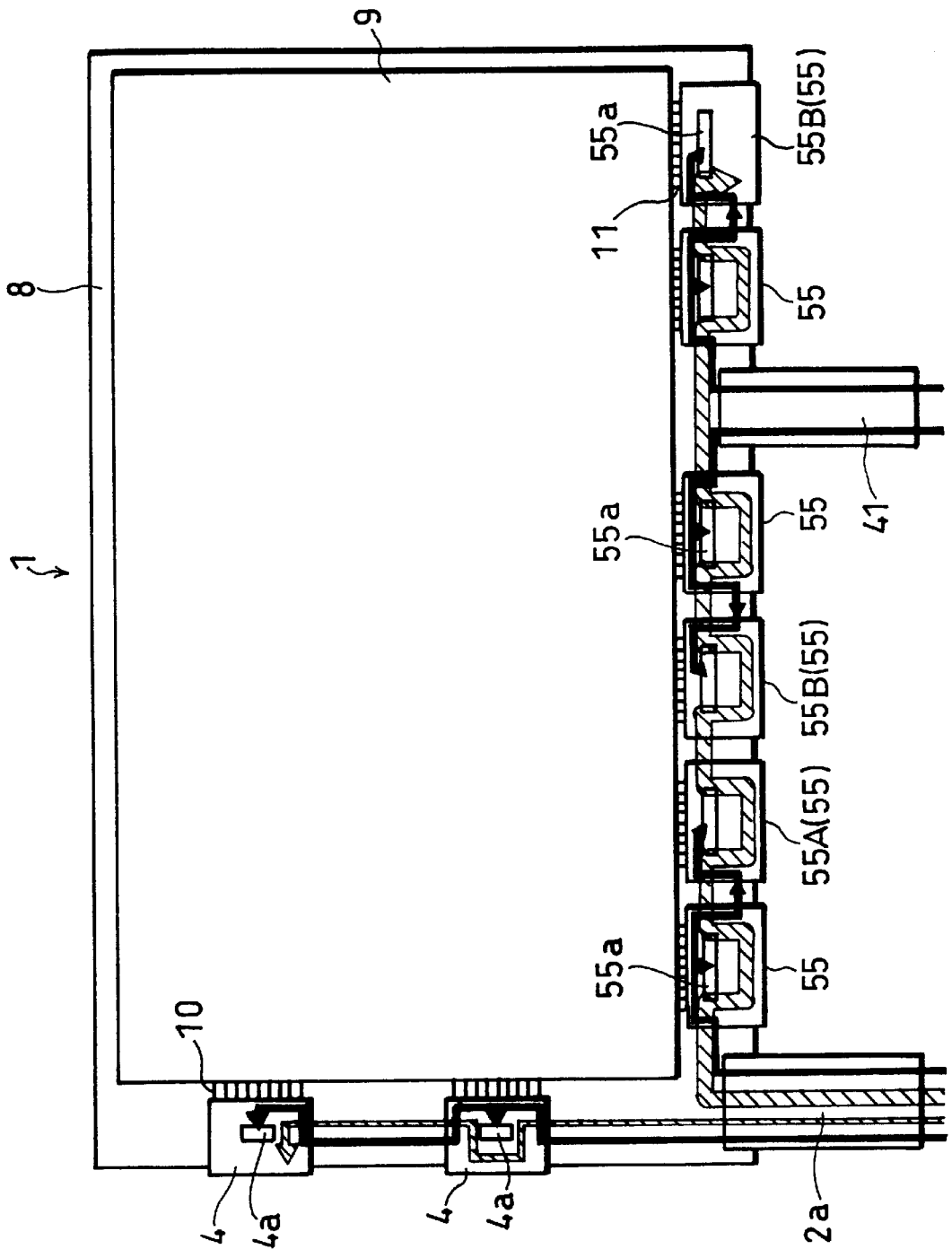
FIG. 9 is a plan view schematically showing an arrangement of a modification to the liquid crystal display device shown in FIG. 6.
Figure 10:
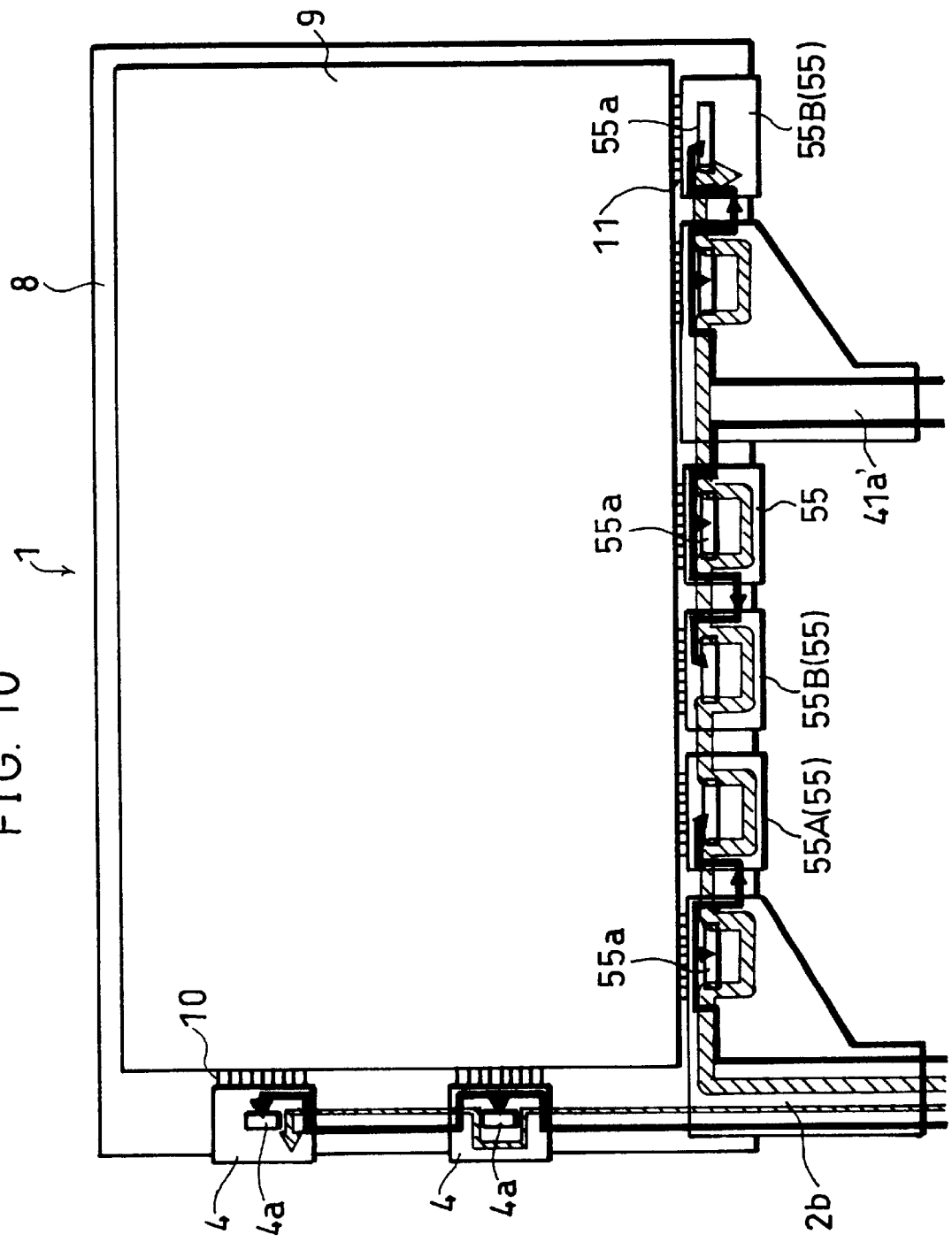
FIG. 10 is a plan view schematically showing an arrangement of a modification to the liquid crystal display device shown in FIG. 9.
Figure 11:
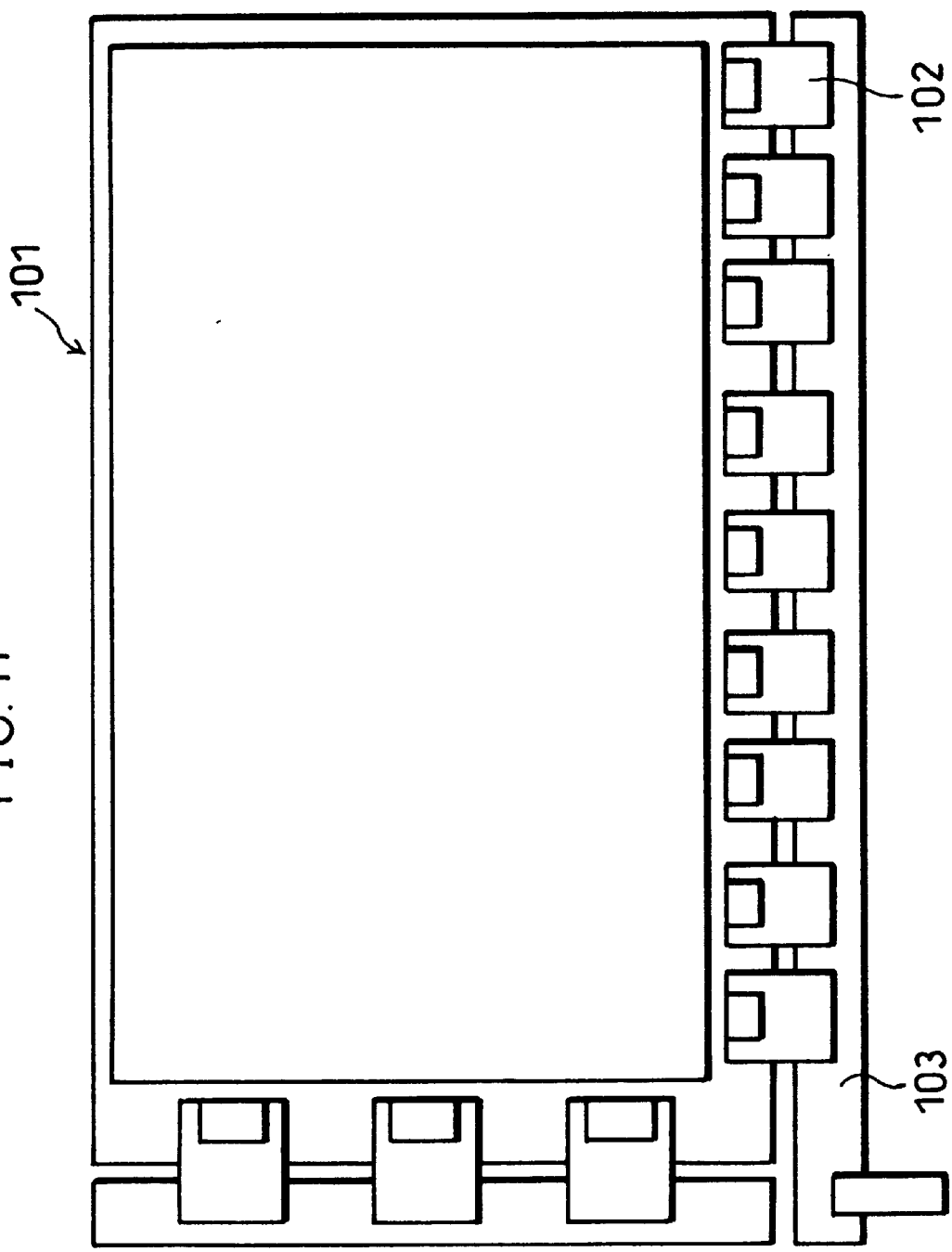
FIG. 11 is a plan view schematically showing a liquid crystal display device which is fabricated using a conventional TCP technique.

FIG. 9 and FIG. 10 show liquid crystal display devices as further examples such that a circuit substrate applies a drive voltage and a drive signal to the gate wires and applies the same drive voltage and drive signal to the source wires. For convenience, members in FIGS. 9 and 10 that have the same arrangement and function as members in FIG. 6, and that are mentioned in the first embodiment are indicated by the same reference numerals and description thereof is omitted.

The liquid crystal display device shown in FIG. 9 includes: a liquid crystal panel 1; a circuit substrate 2*a* to supply drive signals (referred simply to as signals), such as a drive voltage and a drive signal, to both gate wires 10 and source wires 11; and gate TCPs 4 and source TCPs 55 as electrode-connecting-terminal sections to transmit a signal from the circuit substrate 2*a* to the liquid crystal panel 1. Each source TCP 55 is provided with a drive IC (drive means) 55*a*. The circuit substrate 2*a* is located near a corner of the active matrix substrate 8 and electrically connected via panel wires (wires provided on the liquid crystal panel; not shown) to an adjacent one of the gate TCPs 4 constituting a row of gate TCPs and an adjacent one of the source TCPs 55 constituting a row of source TCPs.

Each gate TCP 4 in the row of gate TCPs is electrically connected in series with adjacent gate TCPs 4 via panel wires (gate-drive-voltage supply wires and source-drive-signal supply wires; not shown) A drive voltage (denoted in bold black lines in FIG. 9) and a drive signal (denoted in hatched, thick lines in FIG. 9) supplied by the circuit substrate 2*a* are transmitted sequentially from a gate TCP 4 to the next down along the row of gate TCPs.

Each source TCP 55 in the row of source TCPs is electrically connected in series with adjacent source TCPs 55 via panel wires (source-drive-signal-supply wires; not shown). A drive signal (denoted in hatched, thick lines in FIG. 9) supplied by the circuit substrate 2*a* is transmitted sequentially from a source TCP 55 to the next down along the row of source TCPs. Both the circuit substrate 2*a* and the source input TCP (stabilizer means: circuit substrate) 41 contribute to the collective supply of the source drive voltage, taking account of the decay of drive voltage which occurs in a liquid crystal display device incorporating a larger panel. The collective supply of a source drive voltage will be now discussed.

The circuit substrate 2*a* is electrically connected to an adjacent source TCP 55 via panel wires (source-drive-voltage-supply wires; not shown) to supply a drive voltage to this source TCPs 55. The source TCPs 55, forming a row of source TCPs, are connected in series via panel wires (source-drive-voltage-supply wires; not shown), starting at the source TCP 55 which is adjacent to the circuit substrate 2*a* to a next source TCP 55A. The drive voltage from the circuit substrate 2*a* is sequentially transmitted down along the row of source TCPs 55. The source TCP 55A, being located at the end of the row of source TCPs 55 connected via panel wires, is placed immediately before the drive voltage supplied by the circuit substrate 2*a* falls below a tolerable decay value.

Meanwhile, the source input TCP 41 is placed at a predetermined position along a row of source TCPs (in a gap between two predetermined source TCPs 55) and electrically connected to two adjacent source TCPs 55 via panel wires (source-drive-voltage-supply wires; not shown). With this structure, the source input TCP 41 can supply a drive voltage in two directions along the row of source TCPs. The source TCPs 55 located both to the right and left of the source input TCP 41 are connected in series via panel wires (source-drive-voltage-supply wires; not shown), starting at the two source TCPs 55 which are adjacent to the source input TCP 41 to next source TCPs 55B, the drive voltage from the source input TCP 41 is sequentially transmitted down along the row of source TCPs 55.

The source TCPs 55B, being located at the ends of the rows of source TCPs 55 connected via panel wires, are placed immediately before the drive voltage supplied by the source input TCP 41 falls below a tolerable decay value. One of the source TCPs 55B is located adjacent to the source TCPs 55A to which a drive voltage is supplied by the circuit substrate 2a. With this structure, each source TCPs 55 receives a drive voltage above a tolerable decay value either from the circuit substrate 2a or from the source input TCP 41; therefore, the liquid crystal display device is driven in a stable manner.

The gate drive voltage may be, of course, divisionally and collectively supplied by, the circuit substrate 2a and a gate input TCP which, including a similar arrangement to the source input TCP 41, is disposed between a pair of adjacent gate TCPs 4 constituting the row of gate TCPs. If the drive voltage and the drive signal need to differ between the source lines and the gate lines, a regulator or other component may be mounted to the circuit substrate 2a.

The source input TCP 41 is connected to the source TCPs 55 basically in the same manner as the source input TCP 41 is connected to the source TCPs 5 (see FIGS. 7(*a*) and 7(*b*)). The first wires 43 of FIG. 7(*a*) electrically connect the drive IC 55a on adjacent source TCPs 55 with each other as shown in FIG. 7(*b*). The drive signal from circuit substrate 2a is transmitted via the first wires 43 sequentially to all the source TCPs 55. Meanwhile, the second wires 44 of FIG. 7(*a*) electrically connect the circuit (IC chip) on the source input TCP 41 to the drive IC 55a on the source TCP 55 which is adjacent to the source input TCP 41. The drive voltage from the source input TCP 41 is transmitted via the second wires 44 to the adjacent source TCP 55 and then sequentially to all the other source TCPs 55. In the liquid crystal display device of FIG. 6 in which both the drive voltage and the drive signal are transmitted via the second wires 44 to all the source TCPs 5, the first wires 43 can, of course, be omitted.

The liquid crystal display device of FIG. 10 is similar to the liquid crystal display device of FIG. 9, but is simplified in the structure to supply a drive voltage and a drive signal to source lines. Specifically, (1) a circuit-substrate-mounted TCP (FPC, functioning as a circuit substrate and stabilizer means) 2b is provided integrating the circuit substrate 2a and its adjacent source TCP 55 of FIG. 9; and (2) a stabilizer-means-mounted TCP (FPC, functioning as a circuit substrate and stabilizer means) 41a' is provided integrating the source input TCP 41 and one of its adjacent source TCPs 55. The liquid crystal display device of FIG. 10 has substantially the same wiring structure as that of FIG. 9; therefore, the source drive signal, gate drive signal, and drive voltage are supplied sequentially by the TCP 2b. Both the TCP 2b and the stabilizer-means-mounted TCP 41a' contribute to the collective supply of the gate drive voltage. The TCP 2b and the stabilizer-means-mounted TCP 41a' are both stabilizer means to divisionally and collectively supply a signal to a plurality of source TCPs 55 for the purpose of stabilize a liquid-crystal-drive signal.

As discussed so far, the liquid crystal display device in accordance with the present invention may include:

a circuit substrate for supplying a liquid-crystal-drive signal and voltage to drive means (drive IC) in electrode-connecting-terminal sections (gate TCPs and/or source TCPs); and stabilizer means for supplying only the liquid-crystal-drive voltage to the drive means in electrode-connecting-terminal sections (gate TCPs and/or source TCPs), wherein:

the circuit substrate is provided out of a row of gate TCPs and/or a row of source TCP; and the stabilizer means is provided between a predetermined adjacent gate TCPs and/or source TCPs.

The liquid crystal display device in accordance with the present invention may include electrode-connecting-terminal sections each of which is connected to a predetermined number of drive electrodes provided to a liquid crystal panel and which is provided with drive means capable of driving the predetermined number of the drive electrodes, and further include:

a circuit substrate for supplying a liquid-crystal-drive signal (drive signal) and voltage (drive voltage) to the electrode-connecting-terminal sections; and stabilizer means for supplying only the liquid-crystal-drive voltage to the electrode-connecting-terminal section, wherein:

the drive means in the electrode-connecting-terminal section are connected in series with the circuit substrate via drive-signal-supply wires;

some of the electrode-connecting-terminal section are connected in series with the circuit substrate via drive-voltage-supply wires; and the drive means of the other electrode-connecting-terminal sections are connected in series with the stabilizer means via drive-voltage-supply wires.

Generally, the drive voltage is more likely to decay than the drive signal. In a structure in which a circuit substrate disposed at a crossing point of a row of gate TCPs and a row of source TCPs (near a corner of the liquid crystal panel) is solely responsible for supplying a source and/or gate drive voltage, it is likely, depending on the dimensions of the panel and other factors, that the drive voltage is not supplied with a sufficient magnitude to the gate TCPs and/or source TCPs down in the row(s) away from the circuit substrate. In contrast, according to the arrangement, both the circuit substrate and the stabilizer means contribute to collective supply of the drive voltage; therefore, effects of the decay are less serious. The stabilizer means must be disposed along the row of gate TCPs and/or the row of source TCPs between predetermined adjacent TCPs.

The liquid crystal display device in accordance with the present invention is preferably such that the circuit substrate is directly connected only to one or two adjacent electrode-connecting-terminal sections and indirectly and electrically connected, to the other electrode-connecting-terminal sections that are not directly connected to the circuit substrate, via those connecting wires provided between a pair of adjacent electrode-connecting-terminal sections as detailed in the foregoing. Further, the stabilizer means is preferably provided between every adjacent TCPs. Besides, the liquid-crystal-drive signal may be supplied by the circuit substrate to the drive means in the TCPs.

The stabilizer means may be constituted by a flexible substrate on which electronic components are mounted so as to adjust the drive voltage and the drive signal as liquid-crystal-drive signals, with the electronic components mounted to the flexible substrate being electrically connected to the connecting wires.

Further, the stabilizer means may double as means for supplying the drive voltage and the drive signal.

Moreover, the stabilizer means may double as means for supplying the drive voltage and the drive signal, and be provided in plural along a row of TCPs between predetermined adjacent TCPs so as to divisionally and collectively supply the drive voltage and the drive signal via the TCPs.

Under these circumstances, the stabilizer means may be disposed as far down as immediately before the drive voltage and the drive signal transmitted to the TCPs falls below a tolerable decay value. The stabilizer means may be provided in various numbers and positions depending on the dimensions and resolutions of the liquid crystal display device; a larger panel with higher resolution and frequency increasingly requires the drive voltage and the drive signal to be supplied collectively by the use of the stabilizer means.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A liquid crystal display device including a liquid crystal panel in which a liquid crystal is interposed between two substrates on at least one of which drive electrodes for driving the liquid crystal are provided,
    the liquid crystal panel comprising:
        a plurality of electrode-connecting-terminal sections on each of gate and source sides of the panel, each connected to a predetermined number of the drive electrodes and provided with drive means capable of driving the predetermined number of the drive electrodes; and
        a circuit substrate for supplying a liquid-crystal-drive signal to the electrode-connecting-terminal sections, wherein:
            connecting wires are provided between a pair of adjacent electrode-connecting-terminal sections so as to transmit the signal supplied by the circuit substrate sequentially from one electrode-connecting-terminal section to a next; and
            stabilizer means is provided between at least a pair of adjacent electrode-connecting-terminal sections so as to stabilize the signal transmitted via the connecting wires.

2. The liquid crystal display device as defined in claim 1, wherein
    the liquid-crystal-drive signal is supplied by the circuit substrate to the drive means in the electrode-connecting-terminal sections.

3. The liquid crystal display device as defined in claim 1, wherein:
    the stabilizer means is constituted by a flexible substrate to which there is mounted an electronic assembly for adjusting magnitudes of a drive signal and a drive voltage as liquid-crystal-drive signals; and
    the electronic assembly on the flexible substrate is electrically connected to the connecting wires.

4. The liquid crystal display device as defined in claim 3, wherein,
    the electronic assembly includes at least one of electronic components selected from the group consisting of a chip capacitor, a chip resistor, a chip transformer, and a regulator.

5. The liquid crystal display device as defined in claim 3, wherein:
    the drive voltage is at least one of voltages selected from the group consisting of a power source voltage supplied to the drive means in the electrode-connecting-terminal sections, a GND voltage for the electrode-connecting-terminal sections, and an opposite voltage for the liquid crystal panel; and
    the drive signal is supplied to the drive means in the electrode-connecting-terminal sections so as to control operations of the drive electrodes.

6. The liquid crystal display device as defined in claim 1, wherein
    the stabilizer means doubles as means for supplying a drive signal and a drive voltage as liquid-crystal-drive signals to the electrode-connecting-terminal sections.

7. The liquid crystal display device as defined in claim 6, wherein:
    the stabilizer means is provided between pairs of adjacent electrode-connecting-terminal sections; and
    each of the stabilizer means supplies the drive signal and the drive voltage to two electrode-connecting-terminal sections which are immediately adjacent to that stabilizer means, and also, through transmission via the connecting wires, to the other electrode-connecting-terminal sections which are electrically connected to that stabilizer means.

8. The liquid crystal display device as defined in claim 6, wherein,
    the drive voltage is one of voltages selected from the group consisting of a power source voltage supplied to the drive means in the electrode-connecting-terminal sections, a GND voltage for the electrode-connecting-terminal sections, and an opposite voltage for the liquid crystal panel; and
    the drive signal is supplied to the drive means in the electrode-connecting-terminal sections so as to control operations of the drive electrodes.

9. The liquid crystal display device as defined in claim 1, wherein
    each electrode-connecting-terminal section provided with drive means includes either a source tape carrier package provided with a drive IC or a gate tape carrier package provided with a drive IC, or includes both.

10. A liquid crystal display device including a liquid crystal panel in which a liquid crystal is interposed between two substrates on at least one of which drive electrodes for driving the liquid crystal are provided,
    the liquid panel comprising:
        a plurality of electrode-connecting-terminal sections on each of gate and source sides of the panel, each connected to a predetermined number of the drive electrodes and provided with drive mans capable of driving the predetermined number of the drive electrodes; and
        a circuit substrate for supplying a drive signal and a drive voltage as liquid-crystal-drive signals to the electrode-connecting-terminal sections, wherein:
            connecting wires are provided between a specific pair of adjacent electrode-connecting-terminal sections so as to transmit the drive signal and the drive voltage sequentially from one electrode-connecting-terminal section to a next; and stabilizer means is provided between at least a pair of adjacent electrode-connecting-terminal sections so as to stabilize the drive voltage transmitted via the connecting wires, and provides the drive voltage as the liquid-crystal-drive signal to two electrode-connecting-terminal sections which are immediately adjacent to the stabilizer means, and also, through transmission via the connecting wires, to the other electrode-connecting-terminal sections which are electrically connected to the stabilizer means.

11. The liquid crystal display device as defined in claim 10, wherein the liquid-crystal-drive signal is supplied by the circuit substrate to the drive means in the electrode-connecting-terminal sections.

12. The liquid crystal display device as defined in claim 10, wherein:

the drive voltage is at least one of voltages selected from the group consisting of a power source voltage supplied to the drive means in the electrode-connecting-terminal sections, a GND voltage for the electrode-connecting-terminal sections, and an opposite voltage for the liquid crystal panel; and the drive signal is supplied to the drive means in the electrode-connecting-terminal sections so as to control operations of the drive electrodes.

13. The liquid crystal display device as defined in claim 10, wherein:

each electrode-connecting-terminal section provided with drive means includes either a source tape carrier package provided with a drive IC or a gate tape carrier package provided with a drive IC, or includes both.

14. A liquid crystal display device including a liquid crystal panel in which a liquid crystal is interposed between two substrates on at least one of which drive electrodes for driving the liquid crystal are provided, the liquid crystal panel comprising:

a plurality of electrode-connecting-terminal sections on each of gate and source sides of the panel, each connected to a predetermined number of the drive electrodes and provided with drive means capable of driving the predetermined number of the drive electrodes; and connecting wires provided, and establishing electrical connection, between predetermined adjacent electrode-connecting-terminal sections so as to transit a liquid-crystal-drive signal sequentially from one electrode-connecting-terminal section to a next, wherein, circuit substrates, each electrically connected directly to one or two electrode-connecting-terminal sections so as to supply the liquid-crystal-drive signal to other electrode-connecting-terminal sections through transmission via the connecting wires, are provided as stabilizer means for collectively supplying the liquid-crystal-drive signal to electrode-connecting-terminal sections provided along an edge of a peripheral part of the liquid crystal panel so as to stabilize the signal; and the electrode-connecting-terminal sections and the connecting wires are provided in a peripheral part of the liquid crystal panel.

15. The liquid crystal display device as defined in claim 14, wherein:

the circuit substrates are provided between respective pairs of adjacent electrode-connecting-terminal sections along an edge of the liquid crystal display panel; and each circuit substrate supplies the liquid-crystal-drive signal to two electrode-connecting-terminal sections which are immediately adjacent to the circuit substrate, and also, through transmission via the connecting wires, to the other electrode-connecting-terminal sections which are electrically connected to the circuit substrate.

16. The liquid crystal display device as defined in claim 14, wherein each of the electrode-connecting-terminal sections to which the liquid-crystal-drive signal is collectively supplied by the stabilizer means includes either a source tape carrier package provided with a drive IC or a gate tape carrier package provided with a drive IC, or includes both.

17. The device of claim 1, wherein said stabilizer means is for interconnecting adjacent electrode-connecting-terminal sections, and is not connected to any drive electrodes of the liquid crystal panel and is not connected to said circuit substrate.

18. The device of claim 10, wherein said stabilizer means is for interconnecting adjacent electrode-connecting-terminal sections, and is not connected to any drive electrodes of the liquid crystal panel and is not connected to said circuit substrate.

19. The device of claim 14, wherein said stabilizer means is for interconnecting adjacent electrode-connecting-terminal sections, and is not connected to any drive electrodes of the liquid crystal panel.

20. A liquid crystal display device comprising:

a liquid crystal panel including liquid crystal material interposed between first and second substrates;

a plurality of address lines provided on one of the substrates for providing driving signals to the liquid crystal panel;

a plurality of electrode-connecting-terminal sections, each comprising a circuit provided on a flexible substrate, provided on at least one side of the liquid crystal panel, each of the electrode-connecting-terminal sections being electrically connected to a plurality of said address lines; and a circuit for supplying liquid-crystal-drive signals to the electrode-connecting-terminal sections, a plurality of stabilizer circuits, each located between adjacent electrode-connecting-terminal sections, for stabilizing signals transmitted to the electrode-connecting-terminal section, and wherein the stabilizer circuits are for interconnecting adjacent electrode-connecting-terminal sections, and are not connected to any address lines of the liquid crystal panel, and wherein said stabilizer circuits are not connected to said circuit for supplying liquid-crystal-drive signals to the electrode-connecting-terminal sections.

21. The device of claim 20, wherein said stabilizer circuits each comprise a circuit for adjusting magnitude of drive signals supported by a flexible substrate.

22. The device of claim 20, wherein said flexible substrates of the electrode-connecting-terminal sections comprise TAB structures.

23. The device of claim 1, wherein:

a bezel is provided so as to cover said plurality of electrode-connecting-terminal sections; and an aperture is formed in a top surface of the bezel, allowing an upper part of the electrode-connecting-terminal sections to stick out of the aperture.

24. The device of claim 10, wherein:

a bezel is provided so as to cover said plurality of electrode-connecting-terminal sections; and an aperture is formed in a top surface of the bezel, allowing an upper part of the electrode-connecting-terminal sections to stick out of the aperture.

25. The device of claim 14, wherein:

a bezel is provided so as to cover said plurality of electrode-connecting-terminal sections; and an aperture is formed in a top surface of the bezel, allowing an upper part of the electrode-connecting-terminal sections to stick out of the aperture.

26. The device of claim 1, wherein a width of the stabilizer means is narrowed below a width of a connecting terminal of the stabilizer means.

27. The device of claim 10, wherein a width of the stabilizer means is narrowed below a width of a connecting terminal of the stabilizer means.

28. The device of claim 14, wherein a width of the stabilizer means is narrowed below a width of a connecting terminal of the stabilizer means.

* * * * *

UNITED STATES PATENT AND TRADEMARK OFFICE
CERTIFICATE OF CORRECTION

PATENT NO. : 6,618,111 B1
DATED : September 9, 2003
INVENTOR(S) : Nagata et al.

It is certified that error appears in the above-identified patent and that said Letters Patent is hereby corrected as shown below:

Title page,
Item [*] Notice, should read:
-- Subject to any disclaimer, the term of this patent is extended or adjusted under 35 U.S.C. 154(b) by 194 days. --

Signed and Sealed this

Seventh Day of September, 2004

JON W. DUDAS
*Director of the United States Patent and Trademark Office*